United States Patent
Hung et al.

(10) Patent No.: US 8,772,081 B2
(45) Date of Patent: Jul. 8, 2014

(54) MEMORY DEVICE WITH A DOUBLE HELIX BIOPOLYMER LAYER AND FABRICATING METHOD THEREOF

(75) Inventors: Yu-Chueh Hung, Hsin Chu (TW); Wei-Ting Hsu, Hsin Chu (TW); Ting-Yu Lin, Hsin Chu (TW); Ljiljana Fruk, Karlsruhe (DE)

(73) Assignee: National Tsing Hua University, Hsin Chu (TW)

( * ) Notice: Subject to any disclaimer, the term of this patent is extended or adjusted under 35 U.S.C. 154(b) by 15 days.

(21) Appl. No.: 13/596,573

(22) Filed: Aug. 28, 2012

(65) Prior Publication Data
US 2013/0320305 A1  Dec. 5, 2013

(30) Foreign Application Priority Data
May 30, 2012  (TW) .............................. 101119413 A

(51) Int. Cl.
*H01L 51/40* (2006.01)

(52) U.S. Cl.
USPC .. 438/99; 257/40; 257/E51.027; 257/E51.003

(58) Field of Classification Search
CPC . H01L 51/00; H01L 51/0032; H01L 51/0093; H01L 27/28
USPC ................ 257/40, E51.027, E51.003; 438/99
See application file for complete search history.

(56) References Cited

U.S. PATENT DOCUMENTS

| | | | |
|---|---|---|---|
| 6,855,950 B2 * | 2/2005 | McCreery | 257/40 |
| 2002/0089005 A1 * | 7/2002 | Wickramasinghe et al. | 257/295 |
| 2003/0027195 A1 * | 2/2003 | Ford et al. | 435/6 |
| 2013/0316491 A1 * | 11/2013 | Carroll | 438/96 |

OTHER PUBLICATIONS

Hung, Yu-Chueh / Hsu, Wei-Ting / Lin, Ting-Yu / Ljiljana Fruk Photoinduced write-once read-many-times memory device based on DNA biopolymer nanocomposite 2011 American Institute of Physics [doi:10.1063/1.3671153] Published online Dec. 19, 2011.

* cited by examiner

*Primary Examiner* — Shaun Campbell
(74) *Attorney, Agent, or Firm* — Chih Feng Yeh; Huntington IP Consulting Co., Ltd.

(57) ABSTRACT

The present invention relates to a write-once and read-many-times memory device and the fabricating method thereof. The structure of the memory device comprises: a substrate, a first electrode, a double helix biopolymer layer and a second electrode, and a plurality of metal nanoparticles are distributed in the double helix biopolymer layer. The first electrode is disposed on the substrate, the double helix biopolymer layer is disposed on the first electrode and the substrate, and the second electrode is disposed on the double helix biopolymer layer. When illuminating, the memory device will produce a low-conductivity state and high-conductivity state for writing data. Later, when a voltage is applied to the first electrode and the second electrode, the data will be read.

7 Claims, 4 Drawing Sheets

MEMORY DEVICE WITH A DOUBLE HELIX BIOPOLYMER LAYER AND FABRICATING METHOD THEREOF

BACKGROUND

1. Field of Invention

The present invention relates to a memory device and fabricating method thereof, more particularly, the present invention relates to a memory device with a double helix biopolymer layer (such as deoxyribonucleic acid (DNA) biopolymer layer), and the fabricating thereof.

2. Description of Related Art

With developments of digital communications, the requirements for storage devices are increasing.

In generally, digital information will be stored in one or more storage devices with different types. The storage devices are divided generally into two types. One type is a storage media for storing information with long duration, such as: hard disc drivers, optical disc drivers, and the like. Another type is a short duration storage media, such as: random access memory. Typically, the solid state memory could be divided into volatile type memory and non-volatile type memory. The volatile type memory includes random access memory (RAM), such as dynamic random access memory (DRAM), static random access memory (SRAM), and so on; and the non-volatile type memory includes read-only memory (ROM), programmable read-only memory (PROM), erasable programmable read-only memory (EPROM), flash memory, and so on. The difference between the volatile type memory and the non-volatile type memory is that the stored information in the volatile type memory devices will be disappeared when power is cut off, and the non-volatile type memory will keep the stored information all the time no matter the power is applied or not. Thus, the stored information in the volatile type memory should be refreshed the periodically.

The foregoing memory is usually fabricated by inorganic semiconductors, such as crystalline silicon. Although the inorganic semiconductor memory is success in commerce, it still has a lot of problems. The volatile type inorganic semiconductor memory needs continuously current for maintain the stored information, thus the problems, such as overheating condition and high power consumption, will be occurred. Moreover, the non-volatile memory with complicatedly circuit designs will reduce storage density for stored information, and the producing cost is very expensive.

Therefore, in recently years, memory maker intends to use different materials for fabricating, such as organic materials. The cost of the organic materials is cheaper than the cost of the inorganic semiconductor materials, and the organic materials become the popular items now. However, only few organic materials could be used to form a memory device with only one organic material layer for storing data. Moreover, it is difficult to form a conductive layer within the organic material layer, especially to form a metal particle layer. Furthermore, when a memory device with an organic material layer for storing data, the distributions of unit characteristics would be worse because the distances of those conductive nanoparticles are too far.

SUMMARY

One object of the present invention is to solve the problem that the cost of the manufacture is unlikely to be scaled down due to the material of the existing inorganic semiconductor memory is too less.

Another object of the present invention is to solve the problem that the existing organic memory with an organic material layer for storing data is difficult to fulfill the standard requirement of memory industrial.

In order to reach the foregoing objects, the present invention provides a memory device with a double helix biopolymer layer, and the structure of the memory device comprises: a substrate, a first electrode, a double helix biopolymer layer, and a second electrode. Several metal nanoparticles are distributed in the double helix biopolymer layer. Moreover, the first electrode is disposed on the substrate, and the double helix biopolymer layer is disposed on the first electrode and the substrate. The second electrode is disposed on the double helix biopolymer layer. When illuminating (i.e. UV light), the memory device would generate low conductivity state and high conductivity state for writing data. Later, when a voltage is applied to the first electrode and the second electrode, the written data would be read.

In one embodiment of the present invention, the first electrode is a pattern indium tin oxide (ITO) layer. Moreover, in one embodiment of the present invention, the second electrode is a pattern silver (Ag) layer.

In one embodiment of the present invention, the double helix biopolymer layer includes double helix biopolymers and a surfactant. In this embodiment, the material of the double helix biopolymer is selected from materials: deoxyribonucleic acid (DNA) or double helix ribonucleic acid (RNA). Furthermore, the material of the surfactant is selected from materials: cetyltrimethylammonium chloride (CTMA), vinylbenzyltrimethylammonium chloride (VBTMA), benzyltrimethylammonium chloride (BTMA), phenyl-trimethylammonium chloride (PTMA), or combinations thereof.

In one embodiment of the present invention, the material of the metal nanoparticles is selected from materials: silver (Ag) nanoparticles or aurum (Au) nanoparticles.

Furthermore, the present invention also provides a fabricating method of a memory device with a double helix biopolymer layer, and the steps of the fabricating method comprises: firstly, a substrate is provided, and a first electrode is formed on the substrate; subsequently, a double helix biopolymer layer is formed on the substrate and the first electrode, and a plurality of metal nanoparticles are distributed in the double helix biopolymer layer; finally, a second electrode is formed on the double helix biopolymer layer.

In some embodiments of the present invention, the fabricating method of the material of the double helix biopolymer layer comprises the steps of: firstly, a plurality of double helix biopolymers are extracted; subsequently, the extracted double helix biopolymers are added to a surfactant for fabricating a synthesized material; finally, a metal salt and a sensitizer are mixed and added into the synthesized material for fabricating a material of the double helix biopolymer layer. Therefore, the metal salt would be reduced to metal nanoparticles after illuminating, and the metal nanoparticles would be distributed in the synthesized material of the double helix biopolymer.

In the other words, the memory device with a double helix biopolymer layer according to the present invention is utilizing a double helix biopolymer (i.e. DNA biopolymer), metal salts (i.e. silver (Ag) metal salt), surfactants (i.e. CTMA solvent) and sensitizers (i.e. I-2959) to form a biopolymer nanocomposite for being an active layer between two electrodes. The compatibility of double helix biopolymers (i.e. DNA biopolymer) and metal nanoparticles (i.e. Ag nanoparticles) for reducing the metal salt to metal nanoparticles, and the metal nanoparticles will be inserted into the double helix structure of the double helix biopolymers and averagely distribution. In a specific case of the present invention, the metal ions would be inserted into the nitrogenous base between the double helix structure of the DNA biopolymer and averagely distribution. During illumining and the reaction of the sensitizer, the numbers of the metal nanoparticles reduced from the metal salt will increase and become nanopartices with large size. Depending on controlling time of illumination, the memory device would generate high conductivity state and low conductivity state. Therefore, this property would be introduced to memory devices or other devices with optically manipulate.

As mentioned-above, the double helix biopolymers could be obtained more easily, and costs of the memory devices with a double helix biopolymer layer according to the present invention is cheaper than the one of the inorganic semiconductor memory devices for reducing the costs of the production. In addition, the memory device with a double helix biopolymer layer according to the present invention has bigger size than the existing organic memory device, and more reliability.

BRIEF DESCRIPTION OF THE DRAWINGS

The present description will be better understood from the following detailed description read in light of the accompanying drawings, wherein.

DETAILED DESCRIPTION

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

The present invention is utilizing a double helix biopolymer layer, metal salt, surfactant and sensitizer to form a biopolymer nanocomposite for being an active layer between two electrodes. Moreover, the present invention is also utilizing the compatibility between the double helix biopolymers and metal nanoparticles to reduce the metal salt into metal nanoparticles, and the metal nanoparticles will be inserted into the double helix structure of the double helix biopolymers and averagely distribution. Later, during illumining and the reaction of the sensitizer, the numbers of the metal nanoparticles reduced from the metal salt will increase and become nanopartices with large size. Therefore, the element will generate high conductivity state and low conductively state based on the controlled illumination time and intensity. This property would be introduced into memory devices or other devices with optically manipulate.

Figure 1:
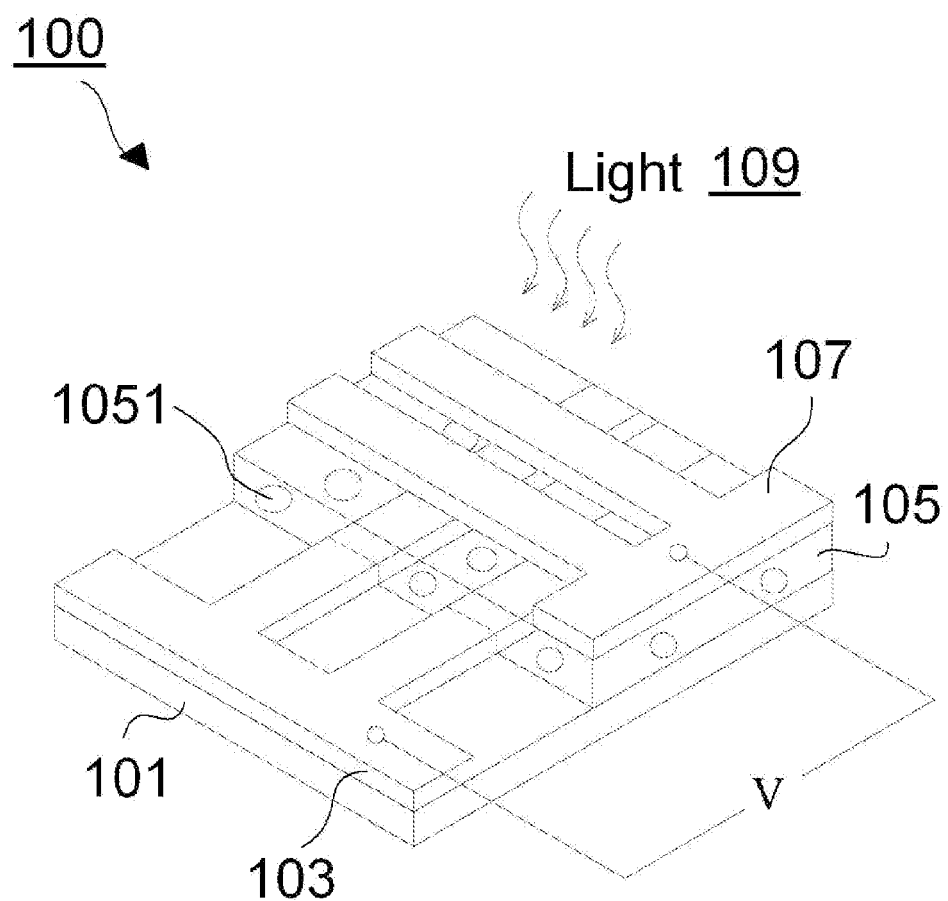
FIG. 1 illustrates a schematic diagram illustrating an embodiment of a memory device according to the present invention.

Referring to FIG. 1, it illustrates a schematic diagram illustrating an embodiment of a memory device according to the present invention. The structure of the memory device 100 is a sandwich structure, and the memory device 100 comprises: a substrate 101, a first electrode 103, a double helix biopolymer layer 105 and a second electrode 107. A plurality of metal nanoparticles 1051 are distributed in the double helix biopolymer layer 105. In this embodiment, the first electrode 103 is disposed on the substrate 101, and the double helix biopolymer layer 105 is disposed on the first electrode 103 and the substrate 101. Further, the second electrode 107 is disposed on the double helix biopolymer layer 105.

Figure 2:
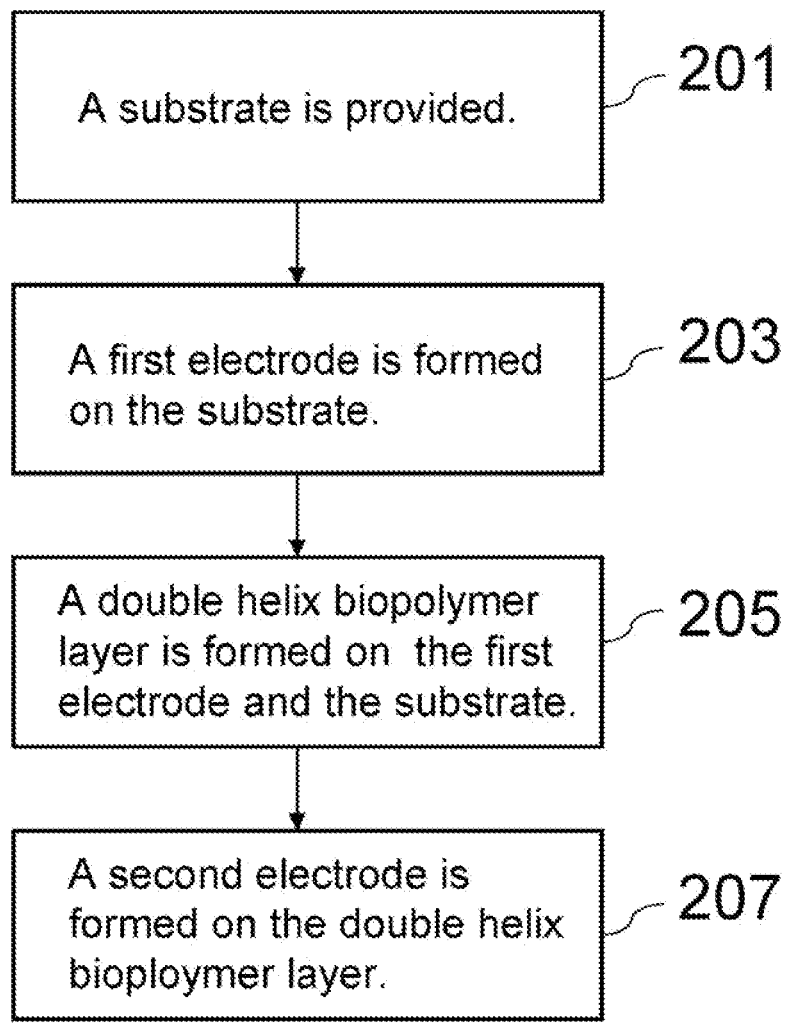
FIG. 2 illustrates a flow chart of a method for fabricating a memory device according to the present invention.

Subsequently, referring to FIG. 2, it illustrates a flow chart of a method for fabricating the memory device according to the present invention. It is introduced with the structure of the memory device shown in FIG. 1.

Firstly, a substrate 101 is provided (Step 201). In this embodiment, the substrate 101 could be a transparent substrate, such as a glass substrate or a plastics substrate. Therefore, the substrate 101 has the capability of light penetration. It's anticipated that any person skilled in the memory device art would use any currently substrate with any material to be the substrate 101 without changing the functions. Thus, it should not be limited.

Secondly, a first electrode 103 is formed on the substrate 101 (Step 203). In this embodiment, the first electrode 103 is a pattern indium tin oxide (ITO) layer. Because the ITO is a transparent electrode material, and the first electrode 103 made of ITO would allow the light to penetrate itself. However, it's anticipated that any person skilled in the memory device art would use any currently conductive material to be the first electrode 103 without changing the functions. Similarly, it should not be limited.

In this embodiment, the first electrode 103 would be formed on the substrate 101 by spattering and etching (such as: dry etching or wet etching) processes. However, it's anticipated that any person skilled in the art should be use any currently process to form the first electrode 103 on the substrate 101 without changing the function. Therefore, it also should not be limited.

Later, a double helix biopolymer layer 105 is formed on the substrate 101 and the first electrode 103 (Step 205). In this embodiment, several metal nanoparticles 1051 are distributed in the double helix biopolymer layer 105.

In aspects of the present invention, the several metal nanoparticle 1051 distributed in the double helix biopolymer layer 105 is implemented via the double helix biopolymers. In the other words, the metal nanoparticle 1051 could be covered and fixed by the double helix structure of the double helix biopolymers.

Figure 3:
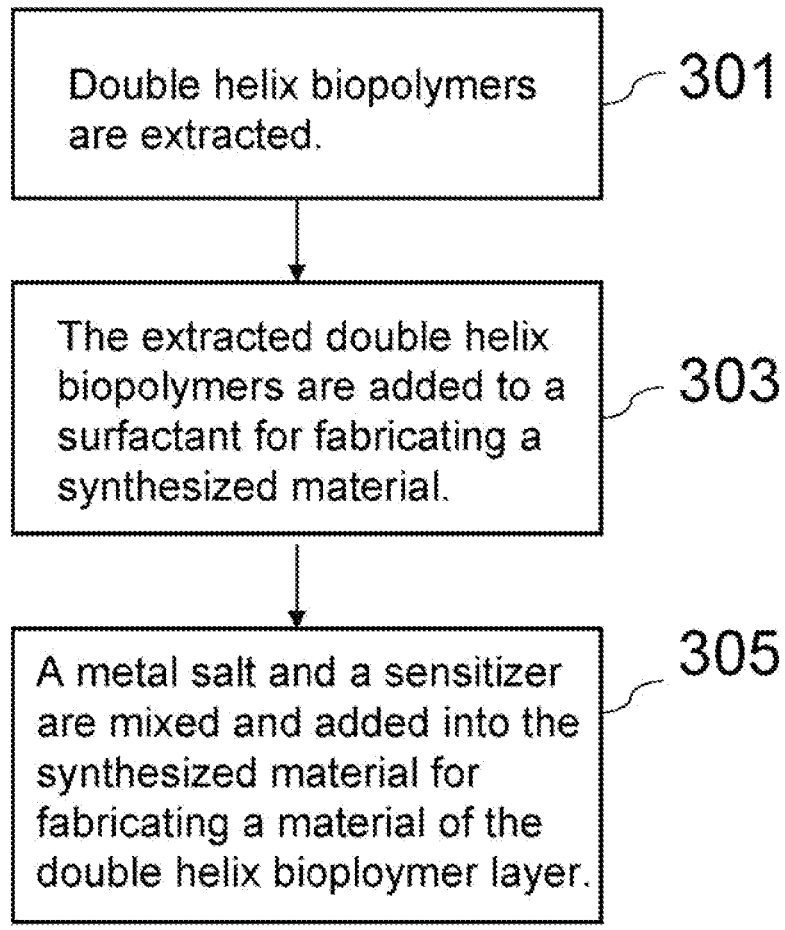
FIG. 3 illustrates a flow chart of a method for fabricating a material of double helix biopolymer layer according to the present invention.

In this step 205, the material of the double helix biopolymer layer 105 should be prepared first. Thus, please refer to FIG. 3, which illustrates a flow chart of a method for fabricating a material of double helix biopolymer layer according to the present invention.

The first step of the fabricating method of the material of the double helix biopolymer layer 105 is that double helix biopolymers are extracted (Step 301).

In certain embodiments of the present invention, the double helix biopolymer should be any biopolymer with double helix structure, such as deoxyribonucleic acid (DNA) or double helix ribonucleic acid (RNA). But, it should not be limited.

In this embodiment, the double helix biopolymer is DNA biopolymer. In one case, the material of the DNA biopolymer is extracted from salmon with high purity. Furthermore, the extracting method comprises sonication.

However, it's anticipated that this case is only used to express, but not to limit the scope of the present invention.

Subsequently, the second step is that the extracted double helix biopolymers are added to a surfactant for fabricating a synthesized material (Step 303).

In some embodiments of the present invention, the surfactant may be any cationic surfactant, such as cetyltrimethylammonium chloride (CTMA), vinylbenzyltrimethylammonium chloride (VBTMA), benzyltrimethylammonium chloride (BTMA), phenyl-trimethylammonium chloride (PTMA), or the combination thereof. But, they should not be limited.

In certain cases of the present invention, when the surfactant are selected from VBTMA solvent, BTMA solvent, or PTMA solvent, the extracted DNA biopolymers in the first step (Step 301) are added to the VBTMA solvent, BTMA solvent, or PTMA solvent for synthesizing to a synthesized material (DNA-BTMA, DNA-VBTMA, or DNA-PTMA).

In the foregoing case, the DNA biopolymers are solved in deionized water firstly, and stirred around twenty-four hours at room temperature. In this case, the molecular weight of DNA biopolymers is dropped down to around 1500 kDa. Later. 10 mL of the DNA biopolymers are added into 10 mL of VBTMA solvent, BTMA solvent, or PTMA solvent for forming a mixed solution, and the mixed solution is stirred around thirty minutes at 50° C. Subsequently, the mixed solution is filtered by centrifugal filters for eight minutes at 4000 rpm. Finally, the mixed solution is solved in ethanol solvent and stirred one hour at 50° C. for obtaining a synthesized material (DNA-BTMA, DNA-VBTMA, or DNA-PTMA).

In this embodiment, as the surfactant is CTMA solvent, similarly, the extracted DNA biopolymers in the first step (Step 301) are added to the CTMA solvent for synthesizing to a synthesized material (DNA-CTMA). In this case, the DNA biopolymers (powdery) are solved in deionized water, the ratio is 6.5 g/L, and stirred around twenty-four hours at room temperature. Later, the molecular weight of the DNA biopolymers is dropped down to 1500 kDa (for example, using a sub-micrometer probing oscillator to oscillate around ten minutes). Subsequently, 10 mL of NDA biopolymer solvent is added to 10 mL CTMA solvent, and stirred around thirty minutes at 50° C. Furthermore, the foregoing mixed solvent is placed in a centrifuge, and rotated with 6000 rpm until the white compounds therein are deposited. The deposited white compounds are placed in an oven for baking twenty four hours at 40° C. Finally, the white compounds are solved in ethanol for obtaining a synthesized material (DNA-CTMA).

It's anticipated that the foregoing cases are embodiments of the present only for expressing, and other double helix biopolymers and other surfactant should be replaced depending on the practical requirements. Moreover, it should not be using the foregoing cases to limit the scope of the present invention.

The third step of the fabricating method of the material of the double helix biopolymer layer is that a metal salt and a sensitizer are mixed and added into the synthesized material for fabricating the material of the double helix biopolymer layer (Step 305).

In certain embodiments of the present invention, the metal salt includes metal salts of silver (Ag) or aurum (Au). However, any person skilled in the art should use other metal salts with similar property depending on the detailed descriptions of the present invention without changing the function. Thus, the metal salt should not be limited in the metal salts in the present embodiments.

In this embodiment, the metal nanoparticles may be silver nanoparticles, and the metal salt compounds may be silver trifluoroacetate. Moreover, in this embodiment, a sensitizer (or a photoinitiator) is added into the solvent in this step, and the silver trifluoroacetate is reduced to silver nano-ions via a photochemical synthesis.

In this case, the sensitizer may be 1-[4-(2-hydroxyethoxy) phenyl]-2-hydroxy-2-methyl-1-propane-1-one (Irgacure-2959 or I-2959).

Thus, the silver trifluoroacetate is added into the synthesized material fabricated in the second step, and stirred for around one day at room temperature. Later, the I-2959 is added into the foregoing mixed solution, in which the molar ratio of DNA biopolymer:silver trifluoroacetate:I-2959 was controlled to be 5:1:5. After the foregoing processes, the material of the double helix biopolymer layer is fabricated.

In this embodiment, utilizing the compatibility of double helix biopolymers and metal nanoparticles to reduce the metal salt to metal nanoparticles, and the metal nanoparticles will be inserted into the double helix structure of the double helix biopolymers. In this specific case, the metal ions would be inserted into the nitrogenous base between the double helix structure of the DNA biopolymer and averagely distribution. Later, during illumining and the reaction of the sensitizer, the numbers of the metal nanoparticles reduced from the metal salt will increase and become nanopartices with large size.

Subsequently, please refer to the step 205 in FIG. 2 again, in this embodiment, after the material of the double helix biopolymer layer is fabricated, the material would be spin-coated for forming on the first electrode 103 and the exposed substrate 101. In one embodiment of the present invention, the material of the double helix biopolymer layer may be spin-coated via 3000 rpm for forming on the first electrode 103 and the exposed substrate 101. Moreover, in this embodiment, the thickness of the double helix biopolymer layer 105 is about 90 nm.

Similarly, the foregoing embodiment is only utilized to express and should not be utilized for limiting the scope of the present invention.

Finally, a second electrode 107 is formed on the double helix biopolymer layer 105 (Step 207). In this embodiment, the second electrode 107 may be a pattern silver (Ag) layer. Similarly, it's anticipated that any person skilled in the memory device art would use any currently conductive material to be the second electrode 107 without changing the functions. Therefore, it should not be limited.

In this embodiment, the second electrode 107 may be utilized thermal evaporation for forming on the double helix biopolymer layer 105. In one case, the second electrode 107 was deposited by thermal evaporation in a vacuum chamber with $4 \times 10^{-6}$ Torr.

However, it's anticipated that any person skilled in the art would use any currently process to form the second electrode 107 on the double helix biopolymer layer 105 without changing the function. Similarly, it should not be limited.

Thus, the memory device 100 with a double helix biopolymer layer of the present invention is fabricated (as shown in FIG. 1). In addition, in some embodiments of the present invention, an epoxy resin and a glass plate are covered on the memory device 100 for protection.

Furthermore, the operation of the memory device 100 with a double helix biopolymer layer according to the present invention is introduced. Please refer to the FIG. 4, which illustrates a schematic diagram of experience results of current-voltage of a memory device according to the present invention.

The memory device 100 with a double helix biopolymer layer according to the present invention is constructed by a double helix biopolymer (i.e. DNA biopolymer), metal salts (i.e. silver (Ag) metal salt), surfactants (i.e. CTMA solvent) and sensitizers (i.e. I-2959) to form a biopolymer nanocomposite for being an active layer between two electrodes. Moreover, the memory device 100 with a double helix biopolymer layer according to the present invention would be wrote information by illumination 109 (as shown in FIG. 1). By controlling time of illumination 109, the memory device 100 would generate high conductivity state 402 and low conductivity state 401, indecently. Therefore, this property would be introduced to memory devices or other devices with optically manipulate.

In this invention, UV light is introduced by one minute, five minutes and ten minutes to generate the illumination effects of the memory device 100. In this case, the wavelength of the UV light is 365 nm, and the intensity of the UV light is 3.5 mW/cm$^2$. The wavelength of 365 nm was employed since it falls within the absorption band of the sensitizer I-2959 and is transparent to DNA biopolymer.

Figure 4:
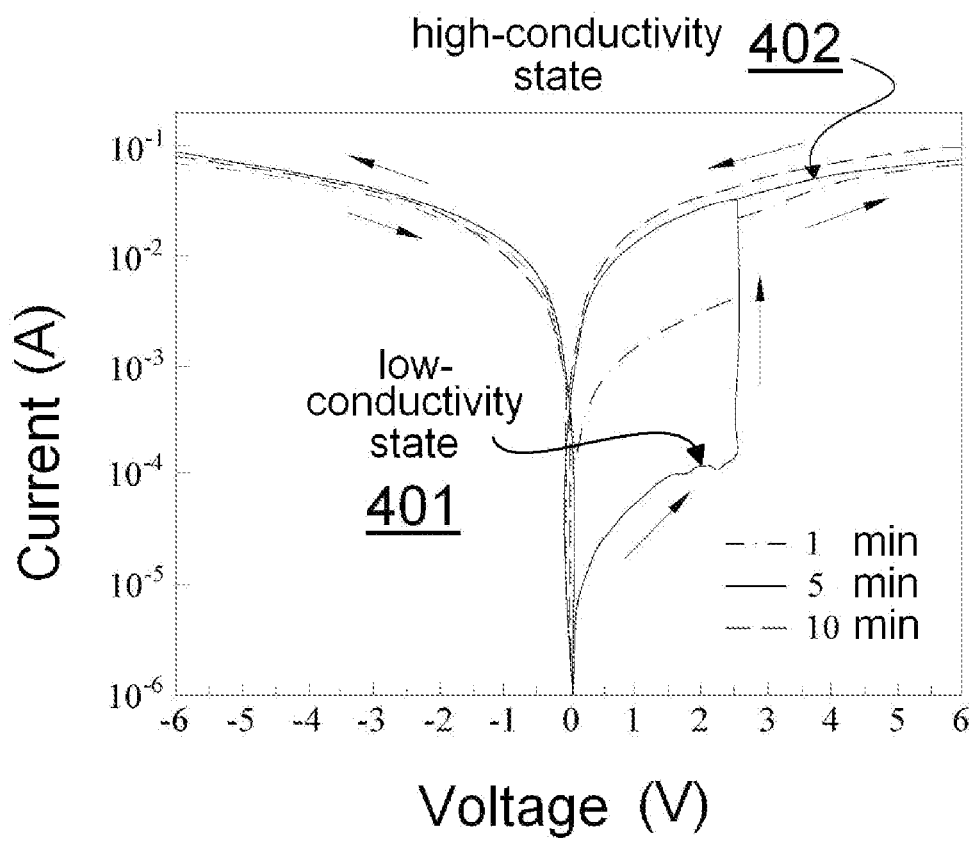
FIG. 4 illustrates a schematic diagram of current-voltage of a memory device according to the present invention.

In FIG. 4, which illustrates current-voltage drawings of the memory device 100, and different dotted lines and the solid line are respecting with the illuminations of one minute, five minutes and ten minutes, respectively. In this embodiment, during illuminations of one minute or five minutes, the first electrode 103 and the second electrode 107 of the memory device 100 are applied by voltage (V) (as shown in FIG. 1) and the applied voltage is around 0~2.6 volts, the memory device 100 would demonstrate in a low conductivity state 401. In another condition, the applied voltage is over than 2.6 volts, the memory device 100 would demonstrate in a high conductivity state 402. In this case, the low conductivity state 401 with a current scale is around $10^{-4} \sim 10^{-5}$ ampere (A), and the high conductivity state 402 with a current scale is around $10^{-2} \sim 10^{-1}$ (A). However, in the experiment results, the effect becomes less evident as irradiation of 10 minutes.

Therefore, the high conductivity state 402 would be considered as an ON state of the memory device 100, and the low conductivity state 401 would be considered as an OFF state. In the subsequent scan, the memory device 100 remained in the high conductivity state 402 and did not return to the low conductivity state 401 by applying a high voltage in either polarity. Thus, the memory device 100 can be employed for the application of write-once read-many-times (WORM) memory element.

As mentioned-above, the double helix biopolymers could be obtained more easily, and costs of the memory devices with a double helix biopolymer layer according to the present invention is cheaper than the one of the inorganic semiconductor memory devices for reducing the costs of the production. In addition, the memory device with a double helix biopolymer layer according to the present invention has bigger size than the existing organic memory device, and more reliability.

It will be understood that the above descriptions of embodiments are given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. A fabricating method of a memory device with a double helix biopolymer layer, the steps of the fabricating method comprising:
   providing a substrate;
   forming a first electrode on said substrate;
   forming a double helix biopolymer layer on said first electrode and said substrate, wherein a plurality of metal nanoparticles are distributed in said double helix biopolymer layer; and
   wherein a fabricating method of materials of said double helix biopolymer layer comprising steps of:
   extracting a plurality of double helix biopolymers;
   adding the extracting double helix biopolymers to a surfactant for fabricating a synthesized material; and
   mixing and adding a metal salt into the synthesized material for fabricating a material of said double helix biopolymer layer;
   forming a second electrode on said double helix biopolymer layer.

2. The fabricating method according to the claim 1, wherein the metal salt is reduced to the metal nanoparticles distributed therein via a sensitizer.

3. The fabricating method according to the claim 1, wherein the metal salt is silver trifluoroacetate.

4. The fabricating method according to the claim 1, wherein said double helix biopolymer layer is formed on said substrate and said first electrode by a spin-coated process.

5. The fabricating method according to the claim 1, wherein said second electrode is formed on said double helix biopolymer layer by thermal evaporation.

6. The fabricating method according to the claim 1, further comprising step of: irradiating a UV light for writing data.

7. The fabricating method according to the claim 6, wherein a wavelength of the UV light is 365 nm, and an intensity of the UV light is 3.5 mW/cm$^2$.

* * * * *